United States Patent [19]

Sen

[11] Patent Number: 5,506,196
[45] Date of Patent: Apr. 9, 1996

[54] MAGNETIC MATERIAL HAVING SUPERCONDUCTIVE PROPERTIES AND A METHOD OF PREPARATION OF THE SAME

[75] Inventor: Mihir Sen, Calcutta, Ind.

[73] Assignee: Magnetic Power, Inc., Sebastopol, Calif.

[21] Appl. No.: 107,026

[22] Filed: Aug. 16, 1993

Related U.S. Application Data

[60] Continuation of Ser. No. 785,449, Oct. 31, 1991, abandoned, which is a division of Ser. No. 599,793, Oct. 16, 1990, Pat. No. 5,126,319.

[51] Int. Cl.$^6$ .............................. H01B 12/00; H01L 39/12
[52] U.S. Cl. ......................... 505/121; 505/110; 505/125; 505/776; 505/782; 505/784; 252/518; 252/521
[58] Field of Search .................................... 505/100, 776, 505/782, 784, 110, 120, 121, 125; 252/518, 521

[56] References Cited

U.S. PATENT DOCUMENTS

| | | | |
|---|---|---|---|
| 4,994,432 | 2/1991 | Hermann et al. | 505/120 |
| 5,126,319 | 6/1992 | Sen | 505/1 |

OTHER PUBLICATIONS

Frank et al., "Electronic Structure of Thallium Barium Calcium Copper Oxide High Tc Superconductors", *Physica C.* 162–164 (Pt. II) 1355–6, 1989.

Mackrodt, "Calculated Lattice Structure, Stability and Properties of the Bismuth Alkaline Earth Cuprate Series . . . ", *Supercond. Sci. Tech.*, vol. 1(6), pp. 343–348, 1989.

*Primary Examiner*—Paul Lieberman
*Assistant Examiner*—M. Kopec
*Attorney, Agent, or Firm*—Townsend and Townsend and Crew

[57] ABSTRACT

A super conducting material is disclosed which exhibits super conducting properties at higher temperatures than known so far. The super conducting by the invented materials is exhibited at temperatures of over 110° K. Various combinations of the components exhibits superconductivities even at temperatures of around 273° K. or even around 300° K. Contrary to known art superconducting materials, which require super cooled conditions and are suited only to sophisticated applications, and thereby have limited applications, the materials of this inventions do not always require super cooled conditions are suited for limitless applications and can work even at room temperature conditions. While a large range of choice of materials are suggested a few important combinations are made of oxides of Bismuth, Barium and Copper. Replacement of Barium by Thallium gives additional advantages. The above materials can be formed into compacts, wire products or applied as thin coatings on substrates made of refractory materials. In forming thin coatings on refractory substrates, use of buffer layer/s of Zirconia or silver oxide provided highly promising results. The invention also suggest suitable methods for the manufacture of different forms of the super-conducting material.

3 Claims, 4 Drawing Sheets

MAGNETIC MATERIAL HAVING SUPERCONDUCTIVE PROPERTIES AND A METHOD OF PREPARATION OF THE SAME

This is a continuation of application Ser. No. 785,449, filed Oct. 31, 1991, now abandoned, which application is a Division of Ser. No. 07/599,793, filed Oct. 16, 1990, now U.S. Pat. No. 5,126,319.

This invention relates to improved magnetic material having super-conducting properties at room temperature and to a method of preparation of the same.

Magnetic material having super-conducting properties are already known in the art and methods of preparation are already known in the art and methods of preparation are also available in the literature. Such materials have super-conducting properties only at very low temperatures or in other words, under super-cooled conditions. Because of this, the presently known super-conducting materials have very limited applications and also require complicated technology to manufacture the same.

It is already known to prepare super-conducting material from Titanium, Berilium, Silicon and Copper metal powders, which exhibit super-conducting properties at a very low temperature of 30° K. in liquid Helium. Also known is super-conducting material made from Niobium, Titanium and Copper metal powders, which also exhibit super-conducting properties at a lower temperature of 30° K. in liquid Helium. Similarly, it is also known to prepare super-conducting materials from Copper, Tin and Niobium metal powders which exhibit super-conducting properties again at 30° K. in liquid Helium.

In view of the very low temperatures involved at which the above materials exhibit super-conducting properties, attempts are continuously made for preparing super-conducting material which exhibits super-conducting properties at higher temperature than before and preferably at around room temperature.

Super-conducting materials mentioned above are conventionally prepared from fine metal powders which are crushed, mixed and sintered at temperatures around 650° C., thereafter compressed under high pressure of a round 5 kg per cm$^2$, vacuum annealed at around 900° C. The material is held at annealing temperature for sufficient time of nearly about 20 Hours and gradually cooled to 550° C., 50° C. per hour, or around. After this level, the material is cooled in open air to room temperature. Test specimen wires drawn from this material are wound on suitable core of iron and this magnet material is super-cooled by immersing in liquid Helium kept at 30° K. at a pressure of about 50 kg per sq. cm.

It will thus be obvious that the known art super-conducting material is useful only for sophisticated applications and keeping it at such super-cooled conditions is also expensive and complicated.

Attempts have been made by Professor K. A. Muller and J. Bednors in 1966 to prepare material having super-conductivity at higher temperatures. However, he could achieve super-conductivity only at temperatures of around 90° K. which is again a super-cooled conductor in liquid nitrogen. Such a material is reported to have been prepared from oxides of yttrium, barium and copper. Here again, the required oxides are mixed and ground, sintered and compressed into rods which under super-cooled conditions exhibit super-conducting properties. It is also reported that the compressed sintered powder can be sprayed as a microfilm on a core of iron or ceramic base, which also exhibited super-conducting properties at temperatures of around 90° K. in liquid nitrogen.

Various other improvements have been made on this material using yttrium, barium and copper oxides, by many Research Workers all over the world but such works have resulted only in super-conducting material at temperatures of about 110°–115° K.

There is no material having super-conducting properties at temperatures of about 115° K.

It is, therefore, an object of this invention to prepare super-conducting material which exhibits super-conducting properties at temperatures above the temperatures known in the art.

It is another object of this invention to prepare super-conducting material which exhibits super-conducting properties at around room temperature.

It is a further object of this invention to prepare super-conducting material from readily available sources without complicated technology.

It is a still further object of this invention to propose a super-conducting material which can be made from indigeneously available cheap material and any super-conducting item can be made to required specifications.

It is still a further object of this invention to propose a process for the manufacture of super-conducting material exhibiting super-conducting properties at temperatures higher than known in the art and also at temperatures at around room temperatures.

The invention will now be more fully described with reference to the following illustrative example which is only for the purpose of understanding the invention and is not to be construed as any limitation thereof.

In preparing the super-conducting material of this invention, I have made use of metals and metal oxides of different metals. It has been experimented and found by me that metals or oxides of bismuth, barium and copper powders when made into a final material either as a thin film on a core material or by compression moulding respectively, exhibit very surprisingly and unexpectedly superconducting properties. I have also further noticed that by controlling the homogenisation of the powder before the calculation step, it is possible to obtain super-conducting materials of various grades which exhibit super conductivity at temperatures higher than known in the art. One such material exhibits super-conductivity at temperatures in the range of 150°–200° K. while another variety of material exhibits super-conductivity at temperatures around room temperature v.i.z. at temperatures in the region of 270° to 300° K. and various grades are possible depending upon degree of homogenisation.

I have further discovered that oxides of bismuth can be replaced by oxides thallium (Tl) to get satisfactory super conducting materials. Super conducting material made using the above oxides can also be further improved by doping with a doping agent such as calcium oxide.

It is considered that obtaining a variety of super-conducting materials by the control of homogenisation is a break through in the known technology. It is also considered as a tremendous advancement in technology and a breakthrough to obtain super-conducting material exhibiting super-conductivity at around room temperatures.

The importance and wide applicability of material having super-conductivity at room temperatures need not be explained and its potential is tremendous as an endless number of applications can be developed in the course of time.

In the following example given herein, I have discussed the preparation of two varieties of super-conductors but would like to emphasize that while one another variety exhibits super-conductivity at 270° to 300° K., it is possible to obtain many more varieties of super-conducting material exhibiting super-conductivity in the temperature region of 150° to 300° K.

GENERAL PURPOSE FOR THE PREPARATION OF SUPER CONDUCTING MATERIALS

I. DRY ROUTE

By application of solid state reaction, Bismuth oxide ($Bi_2O_3$), barium carbonate ($B_aCO_3$) and Copper hydroxide carbonate ($CuCO_3.Cu(OH_2)$) are throughly grinded capable of yielding molar quantity of their oxides at the end of the process in a mortor using ethanol as media. After alcohol evaporation, the powder is calcined at 600° C. to 650° C. to decompose copper hydroxide carbonate. The so obtained powder is again pulverized before further thermal treatment.

This produces one variety of super conducting material exhibiting super-conducting property at 150°–200° K. after the final step explained below which is heat treatment.

II. WET ROUTE

Alternatively the three raw materials are first dissolved in an organic solvent to obtain a clearly solution, while a number of aprotic organic solvents are useful, it has been found that solvents like ethanol, propionic acid, acetic acid and a few aldehydes are preferred. For experimental purposes propionic acid has been used as it is found to be advantageous due to its easy availability, purity and non-inter-ference with the materials being used. While sufficient solvent is used to dissolve the powder, it is always preferred to use excess solvent and evaporate the same by heating which has been found to be helpful in obtaining a uniform material. Conventional homogenisation agents are used additionally in the solvent before evaporating the solvent. The solvent is removed by heating until the viscous type of material is obtained. The removal of solvent is stopped as the material reaches a stage which is helpful for the formation of a resin type material. It is not be misconstrued with the resin in the conventional sense. What is to be understood here is that after removing excess solvent, the material obtained shows increased viscosity and is resinous in physical character which can be moulded if required. This produces a variety of super-conducting materials at temperature between 150° to 320° C. after the final step explained below.

It should be noted that in both the above dry method and wet method, bismuth oxides can be replaced by thallium oxides to get a variety of super-conducting materials.

Calcination or Heat Treatment

While the solid state powder or resin-type material obtained in the earlier stages can be moulded under pressure and subjected to heat treatment, I have found that it is preferable to calcine the same without moulding to obtain a powder which is then ground to uniform fine grain size, then moulded and subjected to further heat treatment. It has been observed that the grain size of the particles may not be uniform in the resin and, therefore, if the resin is moulded and subjected to heat treatment, the moulded material may have non-uniform particle sizes in the crystal lattice or the matrix, which might have undesired influence in the final property of the material. It is, therefore, recommended that the resin is first calcined at temperatures of 730° to 760° C. in open air to obtain a powder, which powder is further calcined at increased temperatures of around 750° to 980° C., then ground to uniform particle size and moulded under pressure and the mould subjected to sintering. Uniformity in particle size can be further ensured by any convenient sieving technique. The moulding of the material can be carried out under pressure ranging between 3.5 tons per sq. cm. to 7.0 tons per sq. cm. The sintering is carried out under a current of oxygen in presence of an inert atmosphere, preferably argon or helium and at sub-atmospheric pressure. While a wide range of sintering temperature is possible, I have found that a temperature range of 820° C. to 980° C. is highly advantageously. The sintering is carried out for a period of at least 15 hours which may extend to over 20 hours. If the sintering temperature is less, then the sintering time is more and the moulding pressure is correspondingly high.

By a combination of calcining temperature, molding pressure, sintering atmosphere, sintering temperature and sintering time, it is possible to obtain a number of varieties of super-conducting materials.

The sintered material is subjected to carefully controlled cooling in a closed sintering furnace at the same sintering pressure. The rate of cooling is preferably 50° to 100° C. per hour and the material is cooled to room temperature. The rate of cooling does show greater significant difference in the properties of the final material if the cooling is not carefully controlled up to at least 400° to 450° C. in stages. It is important to control the cooling by not more than 100° C. and not less than 50° C. per hour during the initial stages of cooling and after cooling to a temperature of around 400° C. the material can be cooled at a faster rate.

The final moulded product when subjected to super-conductivity test by the usual Maissner effect, exhibited super-conductivity at temperatures between 150° to 300° K.

TYPICAL EXAMPLES

Following the general process of preparation, the following two typical experiments were conducted. I obtained varieties of super-conducting material under the conditions explained below:

| Para-meters. | Dry Route Expt. No. 1 | WET ROUTE | | Raw materials | Observation |
|---|---|---|---|---|---|
| | | Expt. 2 | Expt. 3 | | |
| Initial calcination Temperature of powder | 625° C. | | | Molar quantities of 3 components | Solvent evaporated and copper hydroxide decomposed in Expt. 2 & 3. |

-continued

| Para-meters. | Dry Route Expt. No. 1 | WET ROUTE Expt. 2 | Expt. 3 | Raw materials | Observation |
|---|---|---|---|---|---|
| Organic solvent used for dissolving homogenised material. | | Propionic acid. | Propionic acid. | Excess solvent for Expt. 2 & 3. | Clear solution obtained in Expt. 2 & 3. |
| Solvent evaporation temperature. | | 215° C. | 215° C. | | Viscosity increased Resin-type material obtained in Expt. 2 & 3. |
| Calcination Temperature. | 720° C. | 750° C. | 980° C. | | Material calcined in Expt. 1–3. |
| Moulding pressure of ground calcined material | 4.5 T Per. sq. cm. | 5.0 T per sq. cm. | 3.5 T per sq. cm. | | Satisfactory molded material obtained in Expt. 1–3. |
| Sintering temp. under oxygen | 800° C. | 850° C. | 960° C. | | Molding sintered satisfactory in Expt. 1–3. |
| Sintering Time | 10 hrs. | 18 hrs. | 16 hrs. | | Sintering was almost complete in Expt. 1. 3. |
| Rate of cooling per hr. | 40° C. per hr. | 50° C. per hr. | 65° C. per hr. | | Inspection showed satisfactory lattice development in Expt. 1–3. |
| Inert gas used with Oxygen for sintering. | Helium | Helium | Argon | | |
| Measurement of effect. | Effect noticed at 180° K. | Effect noticed at temp. range of 150–200° K. | Effect noticed at temp. range of 270–300° K. | | Super conducting material obtained in Expt. 1–3. |

The above three experiments clearly demonstrated the preparation of higher temperature super-conducting material.

In another development of this invention, a thin film super-conductor was prepared using silicon or silicon dioxide substrate.

The following procedure was adopted;

Many high critical temperature materials cannot be produced under thermodynamic equilibrium conditions. The nucleating conditions are of great importance. Zirconia buffer layer has been used between the silicon or silicon dioxide substrate and the superconducting film on top of it. This buffer serves as an effective diffusion barrier, preventing the elements from intermingling during the annealing process. There is great advantage in depositing high-temperature superconductors on silicon because of silicon's dominance in the micro electronics field. By this process chips might employ superconducting lines to interconnect their different functions, dramatically speeding up the rate at which they could process data. This could result in impressive improvement in the performance of high frequency and high speed circuits. I have employed electron beam evaporation to deposit both the Zirconia buffer and the superconducting film onto the silicon or silicon dioxide. This process, performed in a special controlled atmosphere chamber, employs the intense heat of an electron beam to vaporize the materials to be deposited. The vapours then condense in ultra-thin layers on the substrate, which is affixed to the ceiling of the chamber.

I have in first evaporation deposited a 0.4 micron thick layer of silver oxide onto text specimens-(¾×¾) inches rectangles of silicon or silicon dioxide cut from standard single-crystal silicon wafers. Then the metallic constituents of the superconducting film were deposited. The deposition was performed employing a low-pressure Oxygen free atmosphere for one set of experiments. Copper was deposited first, then barium and then bismuth and the sequence was repeated six times to create an 20 layer 'stack' of the three basic ingredients having a total thickness of 0.7 to 0.8 microns. To complete the process, the specimens were annealed in Oxygen at 850°–900° C. for five minutes and then cooled at a rate of 125° C. per hour. In a second set of experimeners, barium fluoride was substituted for barium and an Oxygen pressure of 0.00002 torr was maintained during the sequential evaporation process. After the multilayer superconducting film was developed, the samples were annealed at 860° C. in Oxygen and water vapour and then cooled, in Oxygen only, in a cycle that included a 30 minutes interval at 560° C. The best results the samples that went superconducting at 270° K. were obtained in the second set of experiments, the ones where barium fluoride was substituted for barium as an evaporation source. These specimens had a superconducting thin film with atomic ratio of 1.8:1 for barium to bismuth and 3.0:1 for copper to bismuth. They were annealed for 4 hours at 850° C.

I have further noticed that in view of the high ductibility of $Ag_2O$, it is advantageous to use $Ag_2O$ in place of zirconia and I can still get a wide range of satisfactory super conducting materials.

Several experiments were conducted to test the properties of the materials prepared according to the process of the invention and the following selected few experiments and results confirm the superconducting properties. In place of bismuth, tests were conducted using tantalum also in the above procedure.

Resistivity measurements:

Resistivity measurements were carried out with a four probe technique. Samples 1×1×20 mm³ cut from bulk have been used. Current for measurement of resistance through specimen allowed in 1000 amp, where potential different (P.D.) comes out to be 2 nanovolt which gives $10^{-16}$ ohm meter. Temperature measurement carried out with platinum gold thermocouple through precission bridge. Accuracy achieved ±0.2K.

Critical Current Evaluation: Reference is made to FIGS. 1 to 4 of the accompanying drawings, FIG. 1: reveals critical current density plot as a function of magnetic field for the material under investigation. This is conformity to that obtained with traditional superconductors under cryocooled environment.

Figure 1:
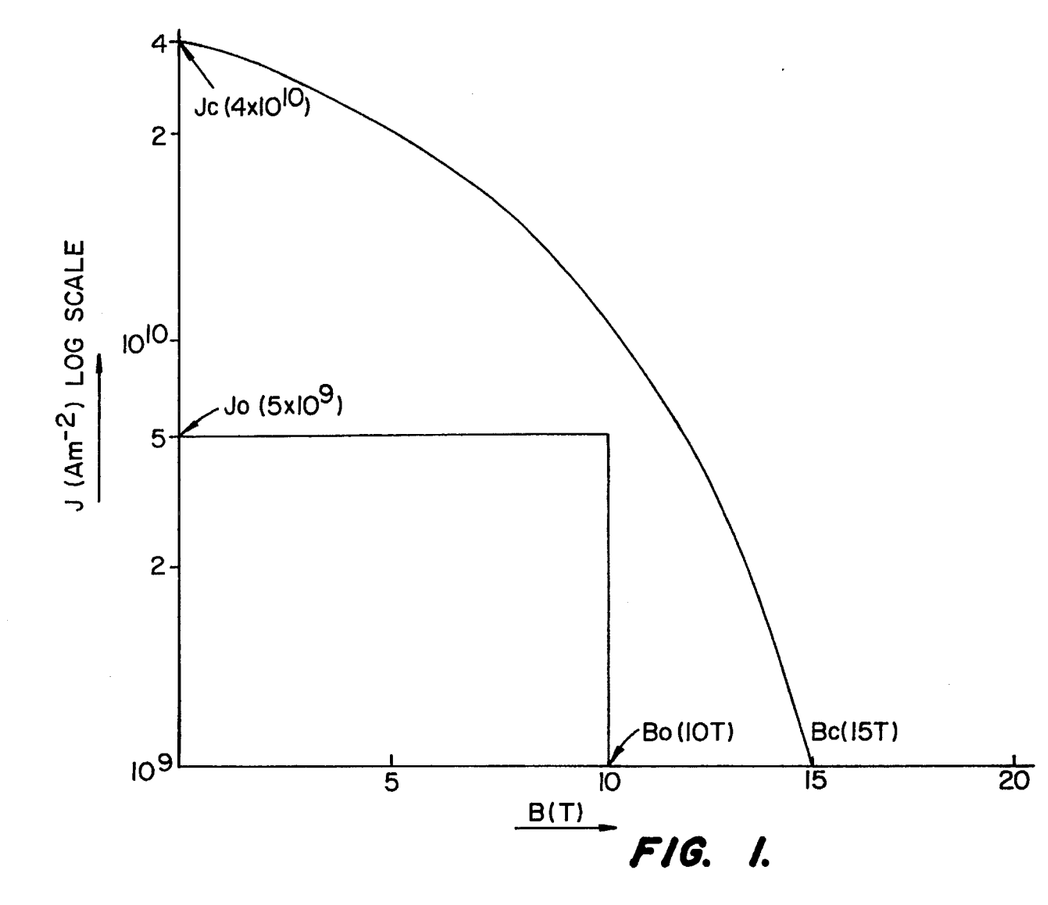
Figure 2:
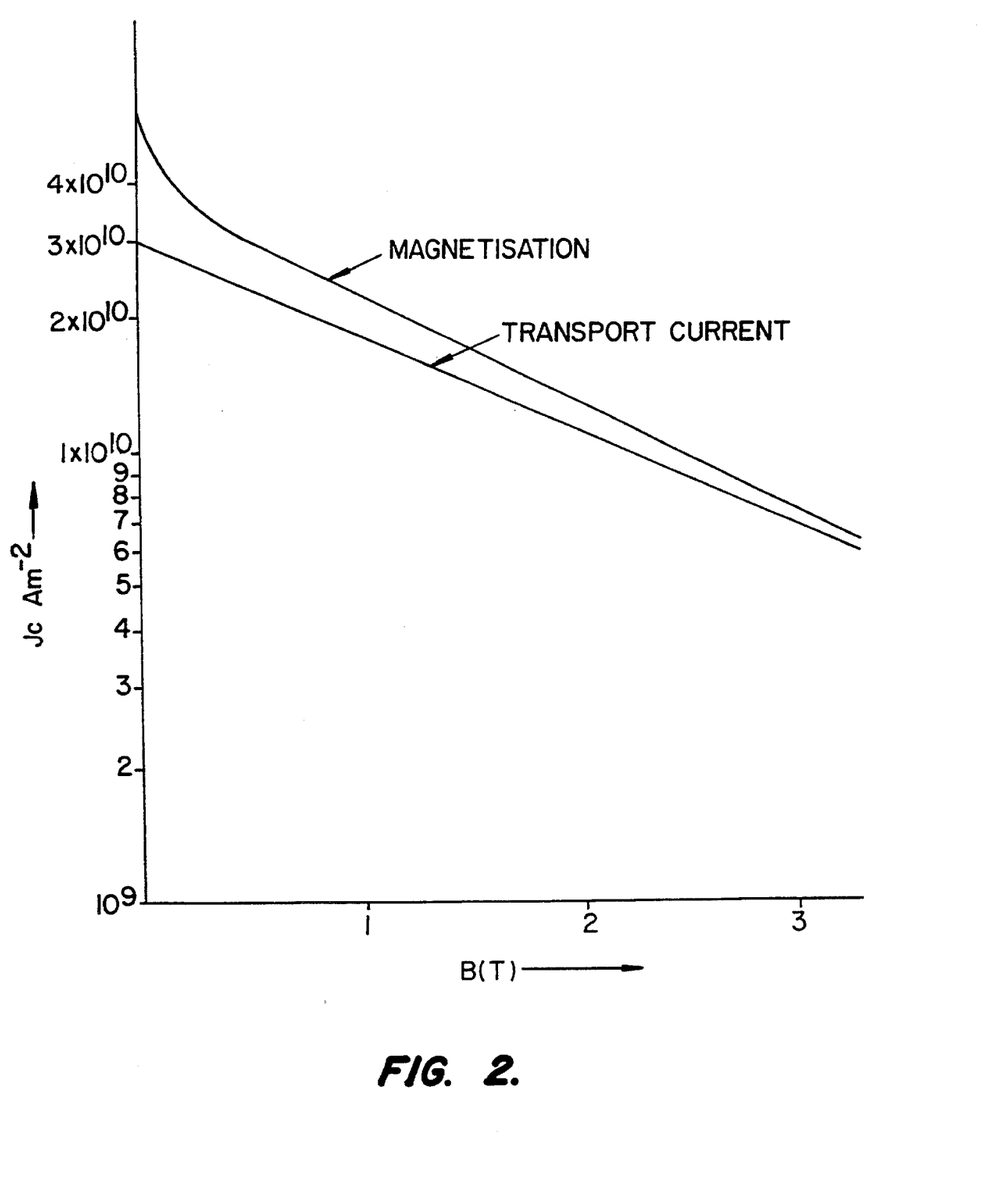

FIG. 2: conforms JC measurement by magnetisiation and transport current technique where low field error is more than at high field where both the techniques yield identical results good for high field applications. Jc has been plotted on log scale for both the figures.

Figure 3:
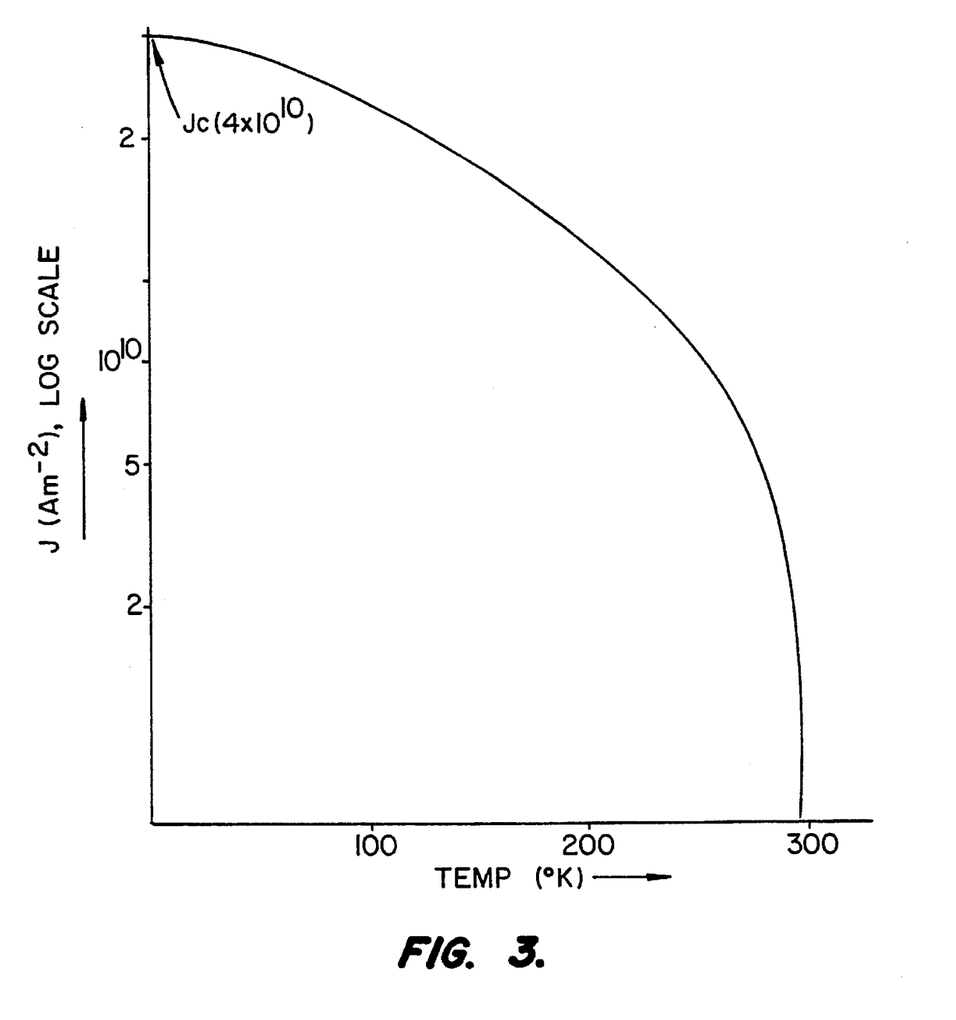

FIG. 3 and Table-2 shows superconductivity domain of the material.

Figure 4:
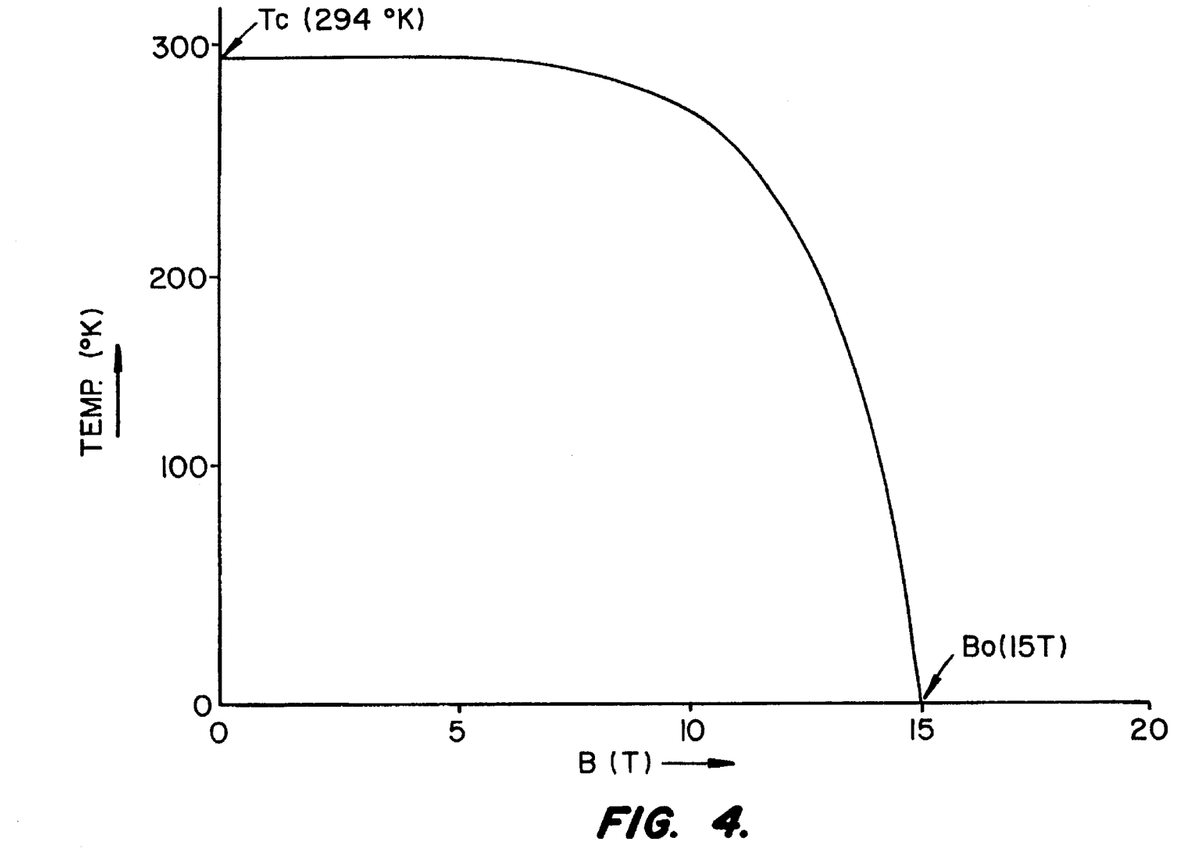

FIG. 4 reveals Tc versus Bc plot of the material under study, where Tc achieved is 294° K. and critical magnetic field is 15T.

TABLE 2 shows superconductivity domain of the material.

| | | |
|---|---|---|
| JC = | Critical current density = | $4 \times 10^{10}$ Am$^{-2}$ |
| JO = | Operating current density = | $5 \times 10^9$ A/m² |
| BC = | Critical magnetic field = | 15 T. |
| BO = | Operating magnetic field = | 10 T. |
| TC = | Critical Temp = | 270°–294° K. |
| TO = | Operating temperature = | 273° L. |
| PO = | Resistivity = | $10^{-6}$ ohm meter. |

Industrial applications:

The main potential and the future of this new superconductivity has always been seen in industrial applications. The areas where the process is under application are reviewed briefly with their main results.

Multiple magnet system for magnetic ore separation:

Processes for magnetic separation of ores and minerals have been major breakthrough in industrial applications. New superconducting magnets which can economically provide high magnetic fields in large volume (30:1), can extend the applicability of magnetic ore separation towards small grain size or weakly paramagnetic ores. In one of our project for separation of silica from Magnesite ore we have been implementing a prototype separator with a specially developed bismuth based oxide magnet. The system has been built with encourageable result. This magnet system consisted of Superconductor race-trace magnets with high current density forming a multipole magnet on the inner circumference of a drum.

Magnetic Resonance Imaging

At present doctors use magnetic resonance imaging machines for scanning patients. For the purpose, machines with superconducting magnets (cooled in helium) are already in use. The powerful magnetic field first aligns the atoms of the body. Then a pulse of radio waves which knocks the atoms out of alignment is transmitted when these atoms return to their previous alignment, they emit a radiation. This produces the detailed image of the soft tissues of the body. The present day machines are very bulky and expensive. The new superconductors could make them small and cheap so that every clinic that conducts body and brain scanning can use them. NMR Magnets during final inspection is shown in FIG. 6.

Quadrupoles for a beam line of decaying particles:

Decay times of hyperons are short ($10^{-10}$S) so that an appreciable part is lot in beam lines. Strange particles (e.g. Ω–) have very low intensities so that counter experiments with reasonable statistics are difficult to perform. Superconducting quadrupoles in such a beam line can appreciably enhance the rate of useful events by shortening the path of the particles to the counter. One such quandrupole has been designed and cross section is shown in FIG. 5. Some of the main parameters are listed in Table 3.

TABLE 3

Main parameters of Superconductor quadrupoles.

| | |
|---|---|
| Maximum field at the coils | 15 T. |
| Field gradient | 160 Tm$^{-1}$ |
| Magnet bore | 30 mm. |
| Length of the quadrupole | 0.75 m. |
| Cylindrical iron yoke | 120 mm |
| Superconductor | 6 AgTl Ba$_2$ Cu$_3$ O$_{10}$ + δ or |
| Phase | Single phase. |
| Winding Configuration | Rectangular blocks |

Superfast Magnetic Trains:

Magnetically levitated (maglev) superfast trains speeding at 500 km/hr could become common place after full development of this new powerful electromagnets, more powerful and economical than present day ones. Maglevs would run faster because they would float about 10 centimeters above a guideway on a cushion of magnetic force. There would be no retarding friction caused by tracks and no derailments either. Model of the magnetically levitated superfast train is shown in FIG. 7. The main parameters are shown in Table-4.

TABLE 4

Main parameters of proposed magnetically levitated train

| | |
|---|---|
| Length of the train | 10 m |
| Width of the train | 3.8 m |
| Height over guideline | 1.7 m |
| Weight | 16 T |
| Max Speed | 600 Km/h |
| Levitation Height, net | 0.1 m |

Thin film superconductors:

Many high critical temperature materials cannot be produced under thermodynamic equilibrium conditions. The nucleating conditions are of great importance. Zirconia buffer layer has been used between the silicon or silicon dioxide substrate and the superconducting film on top of it. This buffer serves as an effective diffusion barrier, preventing the elements from intermingling during the annealing process. There is great advantage in depositing high temperature superconductors on silicon because of silicon's dominance in the microelectronics field. In this process barium fluoride was substituted for barium and an oxygen pressure of 0.00001 torr was maintained during the sequential evaporation process. After the multilayer superconducting film was deposited, the samples were annealed at 850° C. in Oxygen and water vapour and then cooled, in Oxygen only, in a cycle that included a half hour interval at 550° C. The samples went superconducting at 270° K. Main parameters of newly developed superconducting pulsed magnet is shown in Table 1:

TABLE 1

Main parameters of newly developed superconducting pulsed magnets.

| | |
|---|---|
| Central field | 15 T |
| Length of magnet | 0.8 m. |
| Rise time | Several seconds. |
| Heat Leak | 4.2 W. |
| Current | 5,000 smp. |
| Circular aperture of coil | 10 cm. |
| Field homogeneity | $10^{-3}$ |
| Conductor | Bi $Ba_2Cu_3O_{7-x}$ |
| Phase | Single phase |
| Critical transformation temp (TC) | 270 to 294° K. |
| Cryogenic media | Liquid Nitrogen |

I must further mention that in place of $Ag_2O$, I have found that oxides of Au, Pd, Pt, Ir and similar metals are also useful and produce highly satisfactory super conducting materials.

Many high critical temperature materials cannot be produced under thermodynamic equilibrium conditions. The nucleating conditions are of great importance. Silver oxide buffer layer has been used between the silicon or silicon dioxide substrate and the superconducting film on top of it. This buffer serves as an effective diffusion barrier, preventing the elements from intermingling during the annealing process under electro magnetic waves. There is great advantage in depositing high temperature super-conductors on silicon because of silicon's dominance in the micro electronic field. By this process chips might employ sueprconducting lines to interconnect their different functions, dramatically speeding up the rate at which they could process data. This could result in impressive improvement in the performance of high frequency and high speed circuits. I have employed electron beam evaporation to deposit both the silver oxide ($Ag_2O$) buffer and the superconducting film onto the silicon or silicon dioxide. This process performed in a special controlled nitrogen atmosphere chamber where nitrogen will act as doping element in superconducting latices and to employ the intense heat of an electron beam to vapourize the materials to be deposited. The vapour then condenses in ultra thin layers on the substrate which is affixed to the ceiling of the chamber. The silver oxide ($Ag_2O$) is used as a buffer to provide better mechanical strength, improves toughness, improve environmental durability, reduce microcracking, improved densification with the proper superconducting phase, cleaner grain boundries and improved critical current density of the superconducting material. I have in first evaporation deposited a 0.4 micron thick layer of $Ag_2O$ onto test specimens (¼×¾) inches rectangles of silicon or silicon dioxide cut out from standard single-crystal silicon wafers. Then the metallic constituents of the superconducting film were deposited. The deposition was performed employing a low pressure nitrogen atmosphere for one set of experiments. Copper was deposited first, then calcium, then barrium and finally Thantalium or Bismuth and the sequence was repeated six times to create an 24 layer 'stack' of the four basic ingredients having a total thickness of 0.7 to 0.8 microns. To complete the process the specimen was annealed in nitrogen atmosphere at 850°–900° C. for 20 minutes.

In yet another breakthrough, I have conducted several experiments and discovered that in the above preparation, highly unexpected successful super conductors can be obtained by using microwaves. For instance in the above described example, the annealed specimen was further subjected to microwave treatment for these microwaves are launched approximately during this period to orient free electrons in unison. And this power is maintained throughout gama phase when hot stage electron microscope having magnification of one million is fitted to monitor orientation stage. Microwave of 1 KW pulsed power is irradiated for 100's of microsecond. It is possible to use microwaves of the order of 0.7 KW to 3.00 KW depending upon exigencies. Microwaves are applied through three stage of furnace operation viz first stage at 850°–900° C., cooled the material at a rate of 125° C. per hour and passed microwaves at 750° C. to 780° C. Cooled down the specimen further at 150° C. per hour and passed microwave at 600° C. to 630° C. and then the specimen allowed to furnace cooled. Microwaves are applied through three stages of furnace operation to ensure orientation. In process Meissner effect testing is done prior to taking out of third stage of heat treatment in the furnace under nitrogen atmosphere. Here nitrogen will act as doping element to assist along with microwave application to produce 100% orientation. In process Meissner effect testing is done prior to taking out of third stage of 300° K. by microprocessor control. This annealing furnace is made of transparent and highwear resistance material. Magnetic field of 100 gauss is applied for this experimentation. Current density achieved was of the order of $10^4$ A/mm$^2$ and this value has been achieved at 250° to 300° K. In a second set of experiments the powder was produced from $Tl_2O_3$ or $Bi_2O_3$, $BaCO_3$, CaO and CuO. This pressed powder was heated at 950° C. to 970° C. for 24 hrs and slowly cooled at 125° C. per hour. The compact was ground below 325 mesh and pressed and heated to 950° C. to 970° C. in nitrogen atmosphere. This sequence was repeated two more times. At the end of fourth heating the sample was cooled at 60° C. per hour to 700° C. and held for 24 hrs and then furnace cooled. The superconducting material thus produced was ground below 325 mesh and mixed with $Ag_2O$ in the amounts suitable to incorporate 15, 20, 25 and 30 vol./percentage Ag in the material on sintering. The powder mixture was compacted at 15,000 psi and sintered in air at 970° C. for 24 hours and then cooled to 700° C. at 60° C./hr and held for 4 hours and then furnace cooled. The metal or the alloy phase in the superconducting cermet should be a) diamagnetic, b) should not react with the oxygen of the ceramic superconductor, c) should not melt below 950° C. and d) preferably should not form alloys with the metals in the superconducting oxide. Ag, Pd, Au, Pt, Ir, etc. generally satisfy these criteria. $Ag_2O$ is particularly interesting as it decomposes at 230° C. to oxygen and Ag metal and melts at 960° C. Sintering of superconducting oxide with $Ag_2O$ at 965°–970° C. would therefore provide liquid phase sintering without destroying the superconducting oxide. It should be mentioned that when the liquid phase is introduced by partial melting of the superconducting 1-2-3 oxide, densification of the material is achieved at the cost of producing undesired phases. The superconducting $Tl_2Ba_2Ca_2Cu_3O_{10}$+ doped with $N_2$ phase melts incongruently at 1010° C. to 1-2-1 phase plus liquid phases.

In this process the reactant powders are pressed together and heated to around 970° C. The reaction leads to the formation of silver metal and ceramic oxide "Oxygen annealing at 500°–700° C. introduces the necessary amount of oxygen in the ceramic material and forms the superconducting oxide phase. The samples were examined under X-ray." Attempts were also made to examine the possibility of deforming the cermet material at elevated temperature. Hot deformation at 800° C. of cermet samples was tried in a 'deformation simulator'. Two steel plates approximately ⅛ in thick coated with glass lubricant, delta glaze were used for easy separation of the sample from the die. Table I and II show the result of fabrication of $Tl_2Ba_2Ca_2Cu_3 O_{1010+\delta}$ (1:2:3) superconducting ceramic and Ag containing cermets produced from $Tl_2O_3$ $BaCO_3$ and CuO and $Tl_2O_3$, BaO and CuO respectively. It is clear that BaO starting material led to improved bulk density of the material and should be the mately during gama phase around the hollow tubes to orient free electrons in unison. And this radiated power is maintained throughout gama phase when hot stage electron microscope having magnification of one million is fitted to monitor orientation stage. Microwaves of 1 KW pulsed power is irradiated for 100's of microsecond. Microwaves are applied through three stage furnace operation to ensure orientation. In process Meissner effect testing is done prior to taking out of 3rd stage of annealing at 300° K. by microprocessor control. This furnace is made of transparent and high wear resistance material. Magnetic field of 100 gauss is applied for this experimentation. Current density achieved was of the order of $10^4$ $A/mm^2$ at 300° K.

TABLE I

Wire drawing of $TLBa_2Cu_3O_{10+\delta}$ and $Ag-TlBa_2Cu_3O_{10+\delta}$
Cermet samples
(Tl $Ba_2Cu_3O_{10+\delta}$ powder prepared from $Tl_2O_3$, $BaCo_3$ and CuO)

| Composition wt % $TlBa_2Cu_3O_{10+\delta}$ | $Ag_2O$ | Vol % Ag in Cermet | Sintering Temp (°C.) | Time Hrs. | Air anneal Temp (°C.) | Bulk Density g/cc. | % Theoretical Density |
|---|---|---|---|---|---|---|---|
| 100 | 0 | 0 | 970 | 24 | 700 | 4.5 | 73 |
| 75.10 | 24.30 | 15 | 970 | 24 | 700 | 5.39 | 79 |
| 66.70 | 31.30 | 20 | 970 | 24 | 700 | 5.56 | 79 |
| 62.25 | 37.75 | 25 | 970 | 24 | 700 | 5.94 | 82 |
| 56.20 | 43.80 | 30 | 970 | 24 | 700 | 6.67 | 89 |

TABLE II ($TlBa_2Cu_3O_{10+\delta}$ powder prepared from $Tl_2O_3$, BaO & CuO)

| Composition wt % $TlBa_2Cu_3O_{10+\delta}$ | $Ag_2O$ | Vol % Ag in Cermet | Sintering Temp (°C.) | Air anneal Temp (°C.) | Bulk Density g/cc. | % Theoretical Density |
|---|---|---|---|---|---|---|
| 100 | 0 | 0 | 970 | 700 | 5.26 | 85 |
| 75.7 | 24.3 | 15 | 970 | 700 | 5.87 | 86 |
| 68.7 | 31.3 | 20 | 970 | 700 | 6.2 | 88 |
| 62.25 | 37.75 | 25 | 970 | 700 | 6.6 | 90 | preferred raw material for solid state reaction synthesis of this material. $BaCO_3$ decomposes slowly and $CO_2$ reacts with this material. Further Ag addition improves the bulk density of the cermet material. Table II shows that Ag addition reduces the porosity in the samples and improves the bulk density. Approximately 98% dense material could be produced in this way.

I have also fabricated cermet superconductors by 'reaction sintering'. Reaction sintering employs displacement reaction in the solid state. In this process the copper metal powder, $Ag_2O$, $Tl_2O_3$ and BaO powders are pressed together and heated to around 950° to 970° C. The reaction leads to the formation of silver ceramic oxide. Oxygen annealing at 500°–700° C. introduces the necessary amount of oxygen in the ceramic material and forms the orthorhombic superconducting phase. Due to high plastic deformation the material is passed through cold wire drawing machine under vacuum. Thin walled having 500 micron outside diameter and 100 micron inside diameter with one meter in length was produced. End of this wire drawing machine is connected to a laser annealing furnace to maintain temperature up to 950° to 970° C. Internal atmosphere is of Nitrogen so that up to 1.5% of Nitrogen can go in solid solution as a doping which will orient the microstructure and uniform distribution of gama phase is obtained. Microwave are launched approxi- I may here mention that the several stages of heating are only for the purposes of convenience based upon extend of conversion in each stage. The stages of heating can be reduced and can even be a single stage heating. The invention is not therefore to be restricted to number of stages of heating.

Conclusion:

The magnet in a conventional synchrotron accelerator operate at a maximum field of about 1.5T. If these magnets are replaced by superconducting magnets the maximum bending field can be enhanced by a factor 10 to 11 and by application of bismuth based single phase oxide dipoles even 15T can be achieved. The momentum P of the particles is related to the bending field B by the equation $P=\eta QRB$ where $\eta$ is a utilization factor of the bending field. Q the charge of the particles and R the radius of the machine. The machine radius can thus be reduced or the achievable maximum particles energy increased by using the higher bending fields of superconducting magnets. Initially cryogenic and superconducting magnets were considered because it was not yet clear which version would be technically feasible or economically advantageous. A high purity aluminium conductor resistivity ratio γ=P (293K)/P(4.2K) up to 50,000 was developed. A dipole magnet was built, operated and finally compared with a similar version of this magnet with superconducting windings. The goal of this work is to demonstrate that a cryoresistive magnet with a conductor of high purity aluminum can be built with fields up to 5T and to compare its performance with that of a newly developed superconducting magnet having a field of 15T. Both goals are achieved. A magnet with 5T maximum field was built and operated with a single, race track type winding made of aluminium ribbon. The bulk resistivity ratio of the ribbon is 15,000. The ribbon is insulated by anodic oxidation (4 μm). The aluminium winding is finally replaced by the newly developed superconducting one. The optimum operation temperature of this superconducting magnet is found to be in the range of 270° to 294° K. At lower frequencies aclosses showed considerably lower losses at much higher frequencies the magnet is superior because it does not suffer from quenching. The frequency limits have been shifted to higher values and even 150 Hz applications seem now to be feasible without any losses. The result shows that cryoresistive magnets may still be considered for specific applications. The development of bismuth based single phase superconducting material is so rapid that it is now possible to switch fully to applications of super-conductivity.

For testing the properties of the super-conducting material of the invention, I use micropositional electrical probe. Probe is basically a tiny movable arm that is manipulated inside a scanning electron microscope. Arm moves a finely sharpened tungsten needle probe attached to a sandia designed three axis Pieso-mechanical drive. It can measure voltage at any point the needle is made to touch the above Super-conducting metal studied. Probe indicates that 95% thick around each 10–20 micron grain is Super-conductive.

I may here further add that I have studied the behavioural pattern of the elections. Though I do not want to be bound by a theory or do not want to propose any new theory, the following statement is worth consideration.

Prof. John Barden, Dr. L. N. Copper and Prof. J. R. Schrieffer developed the B.C.S. theory (on the basis of the first word of their surname) for which they have received Nobel Prize in 1972. The main finding of that theory was 'Electrons move in a pair to form superconductivity'. All the subsequent developments of super-conductivity material all over the word are mainly on the ceramic material and follow the B.C.S. theory.

The experiments I have carried out which show that the interaction between electrons and protons leads to a chain of electrons and not a pair as stated in B.C.S. theory. As soon as the conductor reaches superconductivity stage, the configuration of the loosely packed electrons changes. Electrons chain themselves and instead of individual electrons moving under the pressure of voltage, the electron chain moves like a marchpast. This time, the movement, since it is in a chain form is free from any resistance (more current) and there are no clashes of electrons (no heat loss). This theory is quite different from the B.C.S. theory on which Prof. Kan Alex Muller and George Bendrorz received the Nobel Prize in the year 1986.

I claim:

1. An oxide superconducting bulk material, produced by a method comprising the steps of:

making a superconducting bulk material product from oxides of bismuth, barium and copper in molar quantities of metals of bismuth, barium and copper in the atomic ratio of 1.0:1.8:3.0; and subjecting said product to microwave treatment of the order of 0.7 KW to 3.00 KW in a furnace in at least one stage at temperatures 600° to 900° C. and to furnace cooling.

2. An oxide superconducting made from metal oxides of bismuth, barium and copper in molar quantities of metals of bismuth, barium and copper in the atomic ratio of 1:1.8:3.0 in the form of molded material or wire products, wherein said molded material or wire products are subjected to microwave treatment of the order of 0.7 KW to 3.00 KW in a furnace in one or more stages at 600° to 900° C. and furnace cooled.

3. An oxide superconducting material as claimed in claim 2, wherein said molded material or wire products is one which is achieved by subjecting a melt to a magnetic field of 98–150 gauss in one or more stages at temperatures between 600° and 850° C.

* * * * *

UNITED STATES PATENT AND TRADEMARK OFFICE
CERTIFICATE OF CORRECTION

PATENT NO. : 5,506,196
DATED : April 9, 1996
INVENTOR(S) : Mohir Sen

It is certified that error appears in the above-identified patent and that said Letters Patent is hereby corrected as shown below:

Column 14, claim 2, line 1 should read -- "An oxide superconducting material made from metal oxides of --.

Signed and Sealed this

Twenty-third Day of July, 1996

Attest:

BRUCE LEHMAN

*Attesting Officer*      *Commissioner of Patents and Trademarks*